(12) United States Patent
Monferrer et al.

(10) Patent No.: US 7,814,339 B2
(45) Date of Patent: Oct. 12, 2010

(54) LEAKAGE POWER ESTIMATION

(75) Inventors: Pedro Chaparro Monferrer, Barcelona (ES); Grigorios Magklis, Barcelona (ES); Jose Gonzalez, Terrassa (ES); Antonio Gonzalez, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 10/594,827

(22) PCT Filed: Jun. 30, 2006

(86) PCT No.: PCT/ES2006/070093

§ 371 (c)(1),
(2), (4) Date: Sep. 28, 2006

(87) PCT Pub. No.: WO2008/000858

PCT Pub. Date: Jan. 3, 2008

(65) Prior Publication Data

US 2008/0244278 A1    Oct. 2, 2008

(51) Int. Cl.
  G06F 1/00      (2006.01)
  G01R 31/26     (2006.01)
  G05B 11/01     (2006.01)

(52) U.S. Cl. .................. 713/300; 361/100; 324/760; 700/22

(58) Field of Classification Search ................. 713/300; 361/100; 324/760; 700/22
  See application file for complete search history.

(56) References Cited

U.S. PATENT DOCUMENTS

| | | | |
|---|---|---|---|
| 5,956,289 A * | 9/1999 | Norman et al. .......... 365/233.1 |
| 6,047,248 A | 4/2000 | Georgiou et al. | |
| 6,518,782 B1 | 2/2003 | Turner | |
| 6,809,538 B1 | 10/2004 | Borkar | |
| 6,842,714 B1 * | 1/2005 | Acar et al. .................. 702/136 |
| 7,245,684 B2 | 7/2007 | Adkisson | |
| 7,600,145 B2 | 10/2009 | Xavier et al. | |
| 2002/0026597 A1 | 2/2002 | Dai et al. | |
| 2003/0071657 A1 | 4/2003 | Soerensen et al. | |
| 2003/0206050 A1 * | 11/2003 | Huard et al. ................ 327/540 |
| 2004/0017234 A1 | 1/2004 | Tam et al. | |
| 2004/0104740 A1 | 6/2004 | Burns et al. | |
| 2004/0210728 A1 | 10/2004 | Flautner et al. | |
| 2005/0044515 A1 * | 2/2005 | Acar et al. .................... 716/5 |
| 2005/0071694 A1 | 3/2005 | Gonzalez et al. | |

(Continued)

FOREIGN PATENT DOCUMENTS

WO    WO-0026747 A1    5/2000

(Continued)

OTHER PUBLICATIONS

International search report for application No. PCT/ES 2006/070093 dated Jan. 26, 2007, 11 pgs.

(Continued)

Primary Examiner—Vincent T Tran
(74) Attorney, Agent, or Firm—Caven & Aghevli LLC

(57) ABSTRACT

Methods and apparatus to provide leakage power estimation are described. In one embodiment, one or more sensed temperature values (108) and one or more voltage values (110) are utilized to determine the leakage power of an integrated circuit (IC) component. Other embodiments are also described.

28 Claims, 6 Drawing Sheets

U.S. PATENT DOCUMENTS

| | | | |
|---|---|---|---|
| 2005/0102539 A1* | 5/2005 | Hepner et al. ............... | 713/300 |
| 2005/0125597 A1* | 6/2005 | Lovett ........................ | 711/106 |
| 2006/0136763 A1 | 6/2006 | Jorgenson et al. | |
| 2006/0155933 A1 | 7/2006 | Buyuktosunoglu et al. | |
| 2006/0221527 A1* | 10/2006 | Jacobson .................... | 361/100 |
| 2007/0001694 A1* | 1/2007 | Jahagirdar et al. .......... | 324/760 |
| 2007/0005152 A1* | 1/2007 | Karr et al. ..................... | 700/22 |
| 2007/0074011 A1* | 3/2007 | Borkar et al. ............... | 712/227 |
| 2007/0204106 A1* | 8/2007 | Donald et al. ............... | 711/118 |
| 2008/0028252 A1 | 1/2008 | Vera et al. | |
| 2008/0056049 A1* | 3/2008 | Moyer et al. ................ | 365/227 |
| 2008/0122524 A1* | 5/2008 | Barrows et al. ............. | 327/537 |

FOREIGN PATENT DOCUMENTS

| | | |
|---|---|---|
| WO | WO-2004066092 A2 | 8/2004 |
| WO | WO-2004084070 A1 | 9/2004 |

OTHER PUBLICATIONS

"English Translation of the Relevant Portion of the International Search Report on PCT / ES 2006/070093", (Jan. 26, 2007), 6 pgs.

Borkar, Shekhar, "Design Challenges of Technology Scaling", *Intel Corporation 0272-1732/99 IEEE*. (Jul.-Aug. 1999), pp. 23-29.

Borkar, Shekhar, et al., "Parameter Variations and Impact on Circuits and Microarchitecture", *DAC 2003*. Copyright 2003 ACM 1-58113-688-9/06/0006,(Jun. 2-6, 2003), pp. 338-342.

Brooks, David, et al., "Dynamically Exploiting Narrow Width Operands to Improve Processor Power and Performance", *Fifth International Symposium on High-Performance Computer Architecture (HPCA-5)*.. (Jan. 1999), 10 pgs.

De, Vivek, et al., "Technology and Design Challenges for Low Power and High Performance", *Intel Corporation, MicroComputer Research Labs*, Hillsboror, OR 97124 / ACM 1-58113-133X. (1999), pp. 163-168.

Donald, James, et al., "Adjusting Leakage Power of Caches", (*Intel Ref: P23175*) Filed Feb. 24, 2006 assigned U.S. Appl. No. 11/361,767.

Ernst, Dan, et al., "Razor: A Low-Power Pipline Based on Circuit-Level Timing Speculation", *Proceedings of the 36th International Symposium on Microarchitecture* (MICRO-36'03), (2003), 12 pgs.

Iyer, Anoop, et al., "Power and Performance Evaluation of Globally Asynchronous Locally Synchronous Processors", *International Conference on Computer Architecture Proceedings of the 29th annual international symposium on Computer architecture*, (2002), pp. 158-168.

Juang, Philo, "Implementing Decay Techniques using 4T Quasi-Static Memory Cells", 4 pgs.

Kaxiras, Stefanos, "Cache Decay: Exploiting Generational Behavior to Reduce Cache Leakage Power", 12 pgs.

Lu, Zhijian, "Reducing Multimedia Decode Power using Feedback Control", 8 pgs.

Magklis, Grigorios, et al., "A Frequency and Voltage Scaling Architecture", Intel Ref #: P20449; Application Filed: Nov. 29, 2004; U.S. Appl. No. 10/999,786.

Magklis, Grigorios, et al., "Frontend Frequency-Voltage Adaptation for Optimal Energy-Delay", *22nd IEEE International Conference on Computer Design: VLSI in Computers & Processors* (ICCD 2004), San Jose, CA, USA, *Proceedings. IEEE Computer Society 2004*. (Oct. 11-13, 2004), pp. 250-255.

Poirier, Christopher, et al., "Power and Temperature Control on a 90nm Itanium-Family Processor", ISSCC 2005 / Session 16 / *Clock Distribution and Power Management / 16.7, Intel Fort Collins*, CO / 0-7803-8904-2 *IEEE*. (2005),pp. 304-305.

Rabaey, Jan, "Issues in Low Power Design—Managing Leakage", *Department of Electrical Engineering and Computer Sciences* University of California Berkeley. (Aug. 25, 2005), 28 pgs.

Restle, Phillip J., et al., "Timing Uncertainty Measurements on the Power5 Microprocessor", *2004 IEEE International Solid-State Circuits Conference*, ISSCC 2004/ Session 19/ Clock Generation and Distribution/19.7,(2004), 8 pgs.

Semeraro, Greg, et al., "Energy-Efficient Processor Design Using Multiple Clock Domains with Dynamic Voltage and Frequency Scaling", *Proceedings of the 8th International Symposium on High-Performance Computer Architecture*, (2002), 12 pgs.

Unsal, Osman, et al., "System and Method for Exploiting Timing Variability", Intel Ref #:P21398: Application Filed: Jun. 20, 2005, U.S. Appl. No. 11/157,320.

Vera, Xavier, et al., "Clustered Variations-Aware Architecture", (Intel Ref: P22414) Filed Dec. 22, 2005 assigned U.S. Appl. No. 10/562,189.

Zhang, Yan, et al., "HotLeakage: A Temperature-Aware Model of Subthreshold and Gate Leakage for Architects", University of Virginia *Dept. of Computer Science Tech Report* CS-2003-05. (Mar. 2003), 15 pgs.

Qiang, W. et al., "Voltage and Frequency Control With Adaptive Reaction Time in Multi-Clock-Domain Processors", *High-Performance Computer Architecture*, HPCA-11, 11th International Symposium on San Francisco, (Feb. 2005), pp. 178-189.

International Search Report and Written opinion for application No. PCT/ES2005/070152 mailed on May 12, 2006, 12 pgs.

Unsal, et al., "Impact of Parameter Variations on Circuits and Microarchitecture", IEEE Micro,vol. 26(6), Nov.-Dec. 2006, pp. 30-39, total 11 pages.

Uht, Augustus K., "Achieving Typical Delays in Synchronous Systems via Timing Error Toleration", University of Rhode Island, Dept. of Electrical Computer Engineering Technical Report No. 032000-0100, Mar. 10, 2000, 21 Pages.

Office Action for U.S. Appl. No. 11/361,767, mailed on Jul. 30, 2009, 16 pages.

Office Action for U.S. Appl. No. 11/361,767, mailed on Oct. 03, 2008, 15 pages.

Office Action for U.S. Appl. No. 10/562,189, mailed on Nov. 13, 2008, 9 pages.

Office Action for GB Patent Application No. GB0900831.9 mailed on Sep. 14, 2009, 2 Pages.

Notice of Allowance for U.S. Appl. No. 10/562,189, mailed on May 22, 2009, 4 pages.

* cited by examiner

LEAKAGE POWER ESTIMATION

BACKGROUND

The present disclosure generally relates to the field of electronics. More particularly, an embodiment of the invention relates to leakage power estimation in an integrated circuit (IC) device.

Power consumption, both dynamic and leakage, is one of the major concerns in IC design. In particular, sub-threshold leakage (or leakage power) may be growing with each successive design generation. For example, as supply voltage is lowered (e.g., to reduce dynamic power consumption), threshold voltage may also be lowered (e.g., to maintain low gate delay or high frequency). However, lowering the threshold voltage may affect leakage power nonlinearly.

In some implementations, leakage power may be assumed to have a constant value during run-time. However, leakage power may vary during run-time, for example, due to changes in temperature, supply voltage, or threshold voltage. Accordingly, power management techniques may be less accurate without knowledge of leakage power.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
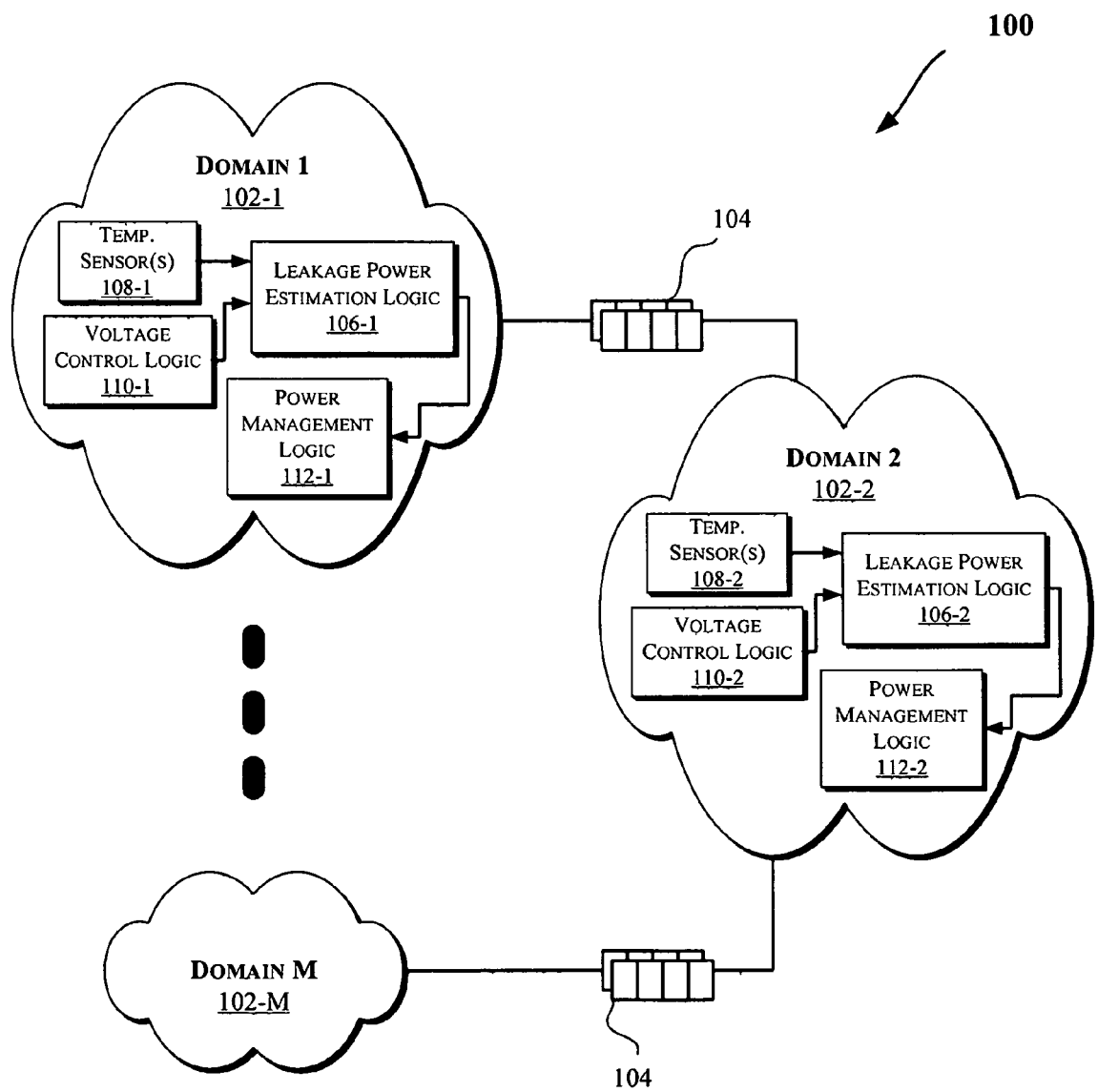
FIGS. 1, 5, and 6 illustrate block diagrams of computing systems in accordance with various embodiments of the invention.

Some of the embodiments discussed herein may provide an efficient technique to estimate leakage power (e.g., static or a sub-threshold leakage power generated by one or more components of an IC device). In an embodiment, the leakage power consumption may be due to one or more variations such as variations in temperature and/or voltage (e.g., threshold and/or supply voltage). Furthermore, some of the embodiments discussed herein may be applied in various computing systems, such as the computing systems discussed with reference to FIGS. 1, 5, and 6. More particularly, FIG. 1 illustrates a block diagram of a computing system 100, according to an embodiment. The system 100 may include one or more domains 102-1 through 102-M (collectively referred to herein as "domains 102" or "domain 102"). Each of the domains 102-1 through 102-M may include various components, but for clarity, sample components are only shown with reference to domains 102-1 and 102-2. Also, each domain 102 may correspond to a portion of a computing system (such as the components discussed with reference to FIGS. 5 and 6, or more generally to one or more transistors of an IC device). In an embodiment, each of the domains 102 may include various circuitry (or logic) that is clocked by a clock signal that may be different than the clock signal used in other domains. In one embodiment, one or more of these clock signals may be mesosynchronous, or otherwise related (e.g., with a relationship that may or may not repeat itself over time).

As illustrated in FIG. 1, each domain may communicate data with other domains through one or more buffers 104. In an embodiment, the buffers 104 may be first-in, first-out (FIFO) buffers. Each domain may include a logic to estimate leakage power of one or more components within the corresponding domain (such as logics 106-1 and 106-2 shown with reference to domains 102-1 and 102-2, respectively, and generally referred to herein as "logic 106" or "logics 106"), one or more temperature sensors (such as sensor(s) 108-1 and 108-2 shown with reference to domains 102-1 and 102-2, respectively), a logic to control frequency and/or voltage levels and/or provide current threshold voltage and/or supply voltage values (e.g., logics 110-1 and 110-2 shown with reference to domains 102-1 and 102-2, respectively), and a logic to manage power consumption of one or more components of the corresponding domain (such as logics 112-1 and 112-2 shown with reference to domains 102-1 and 102-2, respectively, and generally referred to herein as "logic 112" or "logics 112"). In an embodiment, the threshold voltage of a transistor may be adjusted by applying a current to the body (or substrate) of the transistor.

In various embodiments, the power management logic 112 may adjust power consumption of one or more components of a corresponding domain. For example, the logic 112 may utilize information such as the leakage power estimation value (e.g., provided by the corresponding logic 106), dynamic power estimation, and/or some other information (e.g., committed instructions per cycle, cache misses, etc.) to adjust supply voltage and/or threshold voltage of one or more components of the corresponding domain. Also, the logic 112 may adjust the frequency of a clock signal (e.g., a clock signal that is used within at least a portion of the corresponding domain). In an embodiment, the logic 112 may turn off one or more components such: one or more processor cores or portions of the processor cores (e.g., different pipelines, etc.) and/or data caches (e.g., including various levels of caches such as level 1 (L1), level 2 (L2), or other levels) or portions of data caches (e.g., different banks of caches).

Figure 2A:
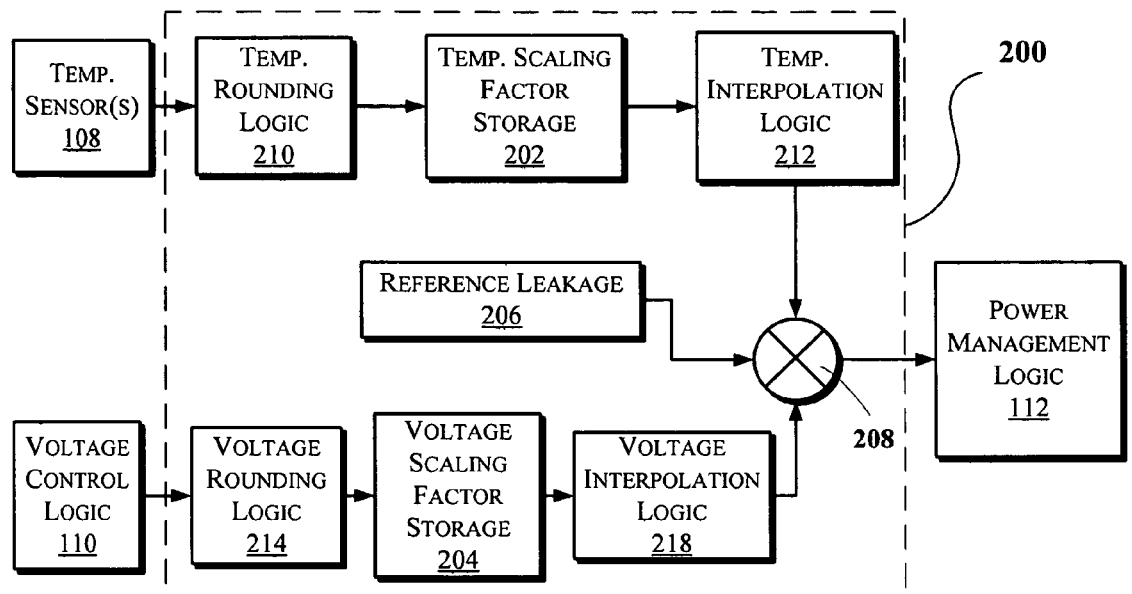
FIGS. 2A and 2B illustrate block diagrams of portions of leakage power estimation systems, according to various embodiments.
Figure 2B:
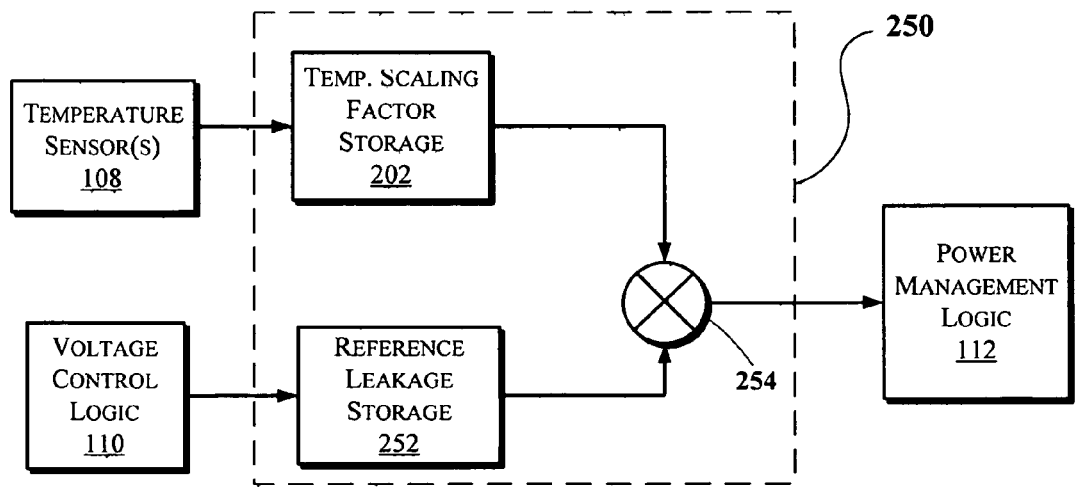

FIGS. 2A and 2B illustrate block diagrams of portions of leakage power estimation systems 200 and 250, according to various embodiments. In one embodiment, the systems 200 and 250 may be the same or similar to the logic 106 discussed with reference to FIG. 1. In an embodiment, the storage units discussed with reference to FIGS. 2A and 2B may be the same or similar to memory components discussed with reference to FIGS. 5 and/or 6.

As shown in FIGS. 2A and 2B, the systems 200 and 250 may include a temperature scaling factor storage unit 202 (e.g., to store a plurality of temperature scaling factor values). The storage unit(s) 202 may receive sensed temperature values from the sensors 108 that correspond to one or more components such as those discussed with reference to FIGS. 1, 5, and 6. The system 200 may also include a voltage scaling factor storage unit 204 (e.g., to store a plurality of voltage factor values) and a reference leakage storage unit 206 (e.g., to store a reference or base leakage power value). The base leakage value stored in the storage unit 206 may be determined at design time (e.g., through simulations or circuit measurements) or at test time. For example, the base leakage value may be determined at test time for designs where there is a relatively high variability (since the base value may be calculated independently for each chip and/or block to allow for adapting the estimations to the specifics of each circuit).

In an embodiment, the system 200 may also include a rounding logic 210 to round temperature values received from the sensors 108 (e.g., such that values sensed may be rounded to a nearest value stored in the storage unit 202). An interpolation logic 212 may interpolate the values, output by the storage unit 202 to actual temperature measurement provided by the sensors 108. Similarly, the system 200 may include a voltage rounding logic 214 (e.g., to round current threshold and/or supply voltage values to a nearest value stored in the storage unit 204) and a voltage interpolation logic 218 (e.g., to interpolate the values output by the storage unit 204 to actual voltage values provided by the control logic 110). A multiplier 208 may multiply the determined temperature scaling factor (e.g., looked up from the storage unit 202 based on sensed temperature values from sensor(s) 108), the determined voltage scaling factor (e.g., looked up from the storage unit 204 based on current voltage values provided by logic 110), and the reference leakage value (from the storage unit 206. The multiplication value may then be utilized to manage power settings (e.g., by the power management logic 112) such as discussed with reference to FIG. 1.

Referring to FIG. 2B, the system 250 may include a reference leakage storage unit 252 that stores base leakage values for a corresponding set of voltages. Accordingly, in one embodiment, a single storage unit (252) may store values that correspond to a combination of values stored in the reference leakage storage unit 206 of FIG. 2A and corresponding values stored in the voltage scaling factor storage 204 of FIG. 2A. For example, a plurality of leakage power values may be indexed by a temperature factor (e.g., provided by the sensor(s) 108) and a voltage factor (e.g., corresponding to the threshold voltage value and/or supply voltage value provided by logic 110). Such an embodiment may allow a single look up (e.g., based on current threshold and/or supply voltage values from the logic 110) to provide a reference leakage value that may be scaled by the temperature scaling factor looked up from the storage unit 202 (e.g., based on sensed temperature value(s) provided by sensors 108) via a multiplier 254. Alternatively, the values stored in the storage units 202, 204, 206, and/or 252 may be combined into a single storage unit (not shown) to allow a single look up to provide a leakage value that corresponds to sensed temperature value(s) provided by sensors 108 and/or current threshold and/or supply voltage values from the logic 110. Also, the system 250 may include rounding and/or interpolation logic (e.g., that may be the same or similar to the logics 210, 212, 214, and/or 218) in accordance with some embodiments.

Figure 3:
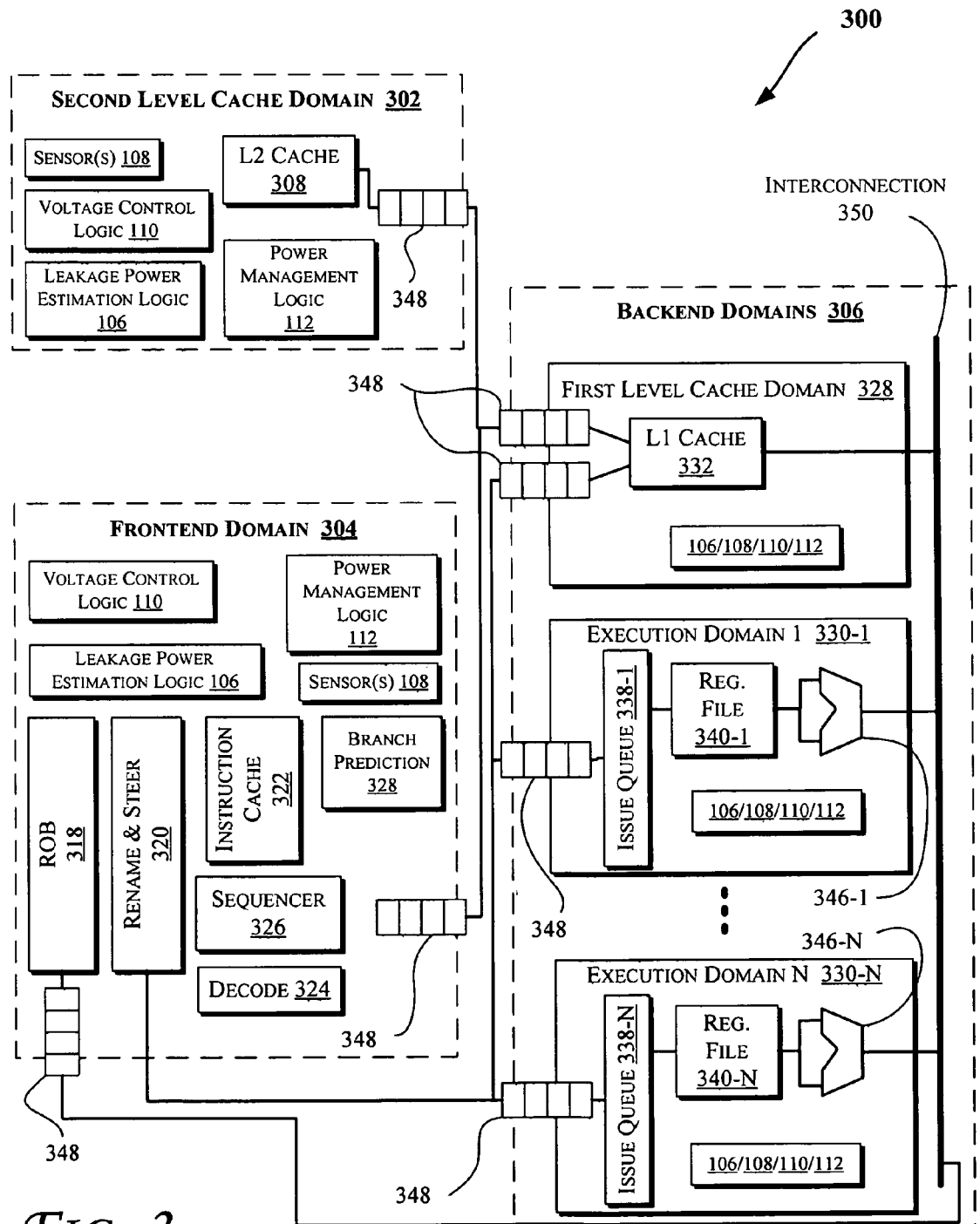
FIG. 3 illustrates a block diagram of a processor core, according to an embodiment.

FIG. 3 illustrates a block diagram of a processor core 300, according to an embodiment. In one embodiment, the core 300 may represent various components that may be present in a processor or number of processors (such as those discussed with reference to FIGS. 5 and 6). The processor core 300 may include one or more domains such as a second level cache domain 302, a frontend domain 304, and one or more backend domains 306. Components within each of the domains 302, 304, and 306 may be clocked by a different clock signal such as discussed with reference to FIG. 1. Moreover, each of the domains (e.g., 302, 304, and 306) may include more or less components than those shown in FIG. 3 in various embodiments.

The second level (L2) cache domain 302 may include an L2 cache 308 (e.g., to store data including instructions), the sensor(s) 108, and logics 106, 110, and 112. In one embodiment, the L2 cache 308 may be shared by multiple cores in a multi-core processor such as those discussed with reference to FIGS. 5 and 6. Also, the L2 cache 308 may be off of the same die as the processor cores. Accordingly, in various embodiments of the invention, a processor may include the domains 304 and 306, and may or may not include the L2 cache 308.

As shown in FIG. 3, the frontend domain 304 may include one or more of the sensor(s) 108, logics 106, 110, and 112, a reorder buffer 318, a rename and steer unit 320, a instruction cache 322, a decode unit 324, a sequencer 326, and/or a branch prediction unit 328. In one embodiment, the frontend domain 304 may include other components such as an instruction fetch unit.

The backend domains 306 may include one or more of a first level (L1) cache domain 328 and one or more execution domains 330-1 through 330-N. The L1 cache domain 328 may include an L1 cache 332 (e.g., to store data including instructions), the sensor(s) 108, and logics 106, 110, and 112. Furthermore, the execution domains 330-1 through 330-N may include one or more of an integer execution unit and/or a floating point execution unit. The execution domains 330-1 through 330-N may each comprise an issue queue (338-1 through 338-N, respectively), a register file (340-1 through 340-N, respectively), the sensor(s) 108, logics 106, 110, and 112, and/or an execution unit (346-1 through 346-N, respectively).

In one embodiment, each of the domains 302, 304, and 306 may include one or more first-in, first-out (FIFO) buffer(s) 348 to synchronize communication between the various clock domains (e.g., between the domains 302, 304, and/or 306).

Additionally, the processor core 300 (and, in an embodiment, such as the one shown in FIG. 3, the backend domains 306) may include an interconnection or bus 350 to facilitate communication between various components of the processor core 300. For example, after an instruction is successfully executed (e.g., by the execution domains 330-1 through 330-N), the instruction commit may be communicated to the ROB 318 (e.g., via the interconnection 350) to retire that instruction. Additionally, the domains within the backend (e.g., domains 328 and 330-1 through 330-N) may communicate via the interconnection 350. For example, communication among execution units (330-1 through 330-N) may occur for type conversion instructions. Further operations of components of FIGS. 1-3 will be discussed with reference to the method 400 of FIG. 4.

Furthermore, even though FIG. 3 illustrates that each of the domains 302, 304, and 306 may include the sensor(s) 108 and logics 106, 110, and 112, various domains may share the same the sensor(s) 108 and logics 106, 110, and 112. For example, a single set of the sensor(s) 108 and logics 106, 110, and 112 may be utilized for all domains of the processor core 300.

Figure 4:
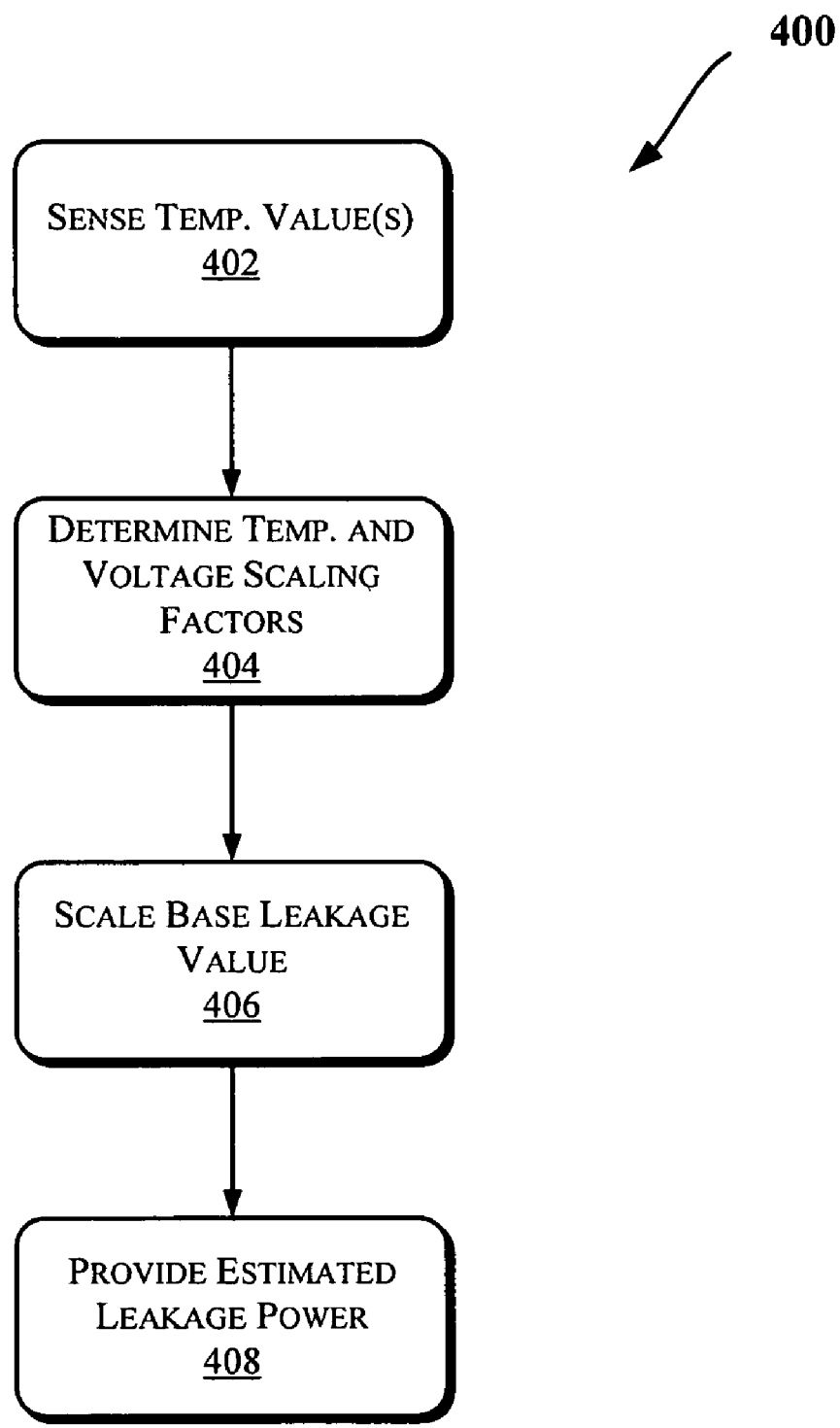
FIG. 4 illustrates a flow diagram of a method, according to an embodiment.

FIG. 4 illustrates a flow diagram of a method 400 to provide estimate leakage power, according to an embodiment. In one embodiment, the operations of the method 400 may be performed by one or more components, such as the components discussed with reference to FIGS. 1-3 and 5-6.

Referring to FIGS. 1-4, at an operation 402, the sensor(s) 108 may sense one or more temperature values corresponding to an IC device. The sensed temperature value(s) may be used to determine a temperature scaling factor (e.g., from the storage unit 202) at an operation 404. At operation 404, a voltage scaling factor may also be determined such as discussed with reference to FIGS. 2A and 2B (e.g., from the storage units 204 and/or 252). At an operation 406, the determined scaling factors of operation 404 may then be used to scale a base leakage value (e.g., stored in the unit 206 and/or 252) such as discussed with reference to FIGS. 2A and 2B. At an operation 408, a signal may be generated (e.g., by the multipliers 205 and 254) that correspond to an estimated leakage power of the IC device. As discussed with reference to FIG. 1, the estimated leakage power (408) may be used to adjust power consumption of one or more components of a computing system (e.g., systems discussed with reference to FIGS. 1, 5, and/or 6).

In an embodiment, the following equation may be used to provide the estimate leakage power at operation 408:

$$P(V_{dd}, V_{th}, T) = P_0 \cdot \frac{V_{dd}}{V_{dd0}} \cdot e^{\beta(V_{dd}-V_{dd0})} \cdot e^{\gamma \cdot (-|V_{th}|+|V_{th0}|)} \cdot e^{\delta(T-T_0)}$$

In the above formula, P corresponds to the estimate leakage power value, $P_0$ corresponds to the base leakage power value (e.g., that may be stored in units 206 and/or 252), $V_{dd}$ corresponds to supply voltage (that may be provided by the logic 110), $V_{th}$ corresponds to threshold voltage (that may be provided by the logic 110), $V_{dd0}$ corresponds to $V_{dd}$ at which base leakage was measured, $V_{tho}$ corresponds to $V_{th}$ at which base leakage was measured, T corresponds to current temperature value(s) sensed by the sensor(s) 108, $T_0$ corresponds to the temperature at which base leakage was measured, δ, β and γ are circuit dependent constants set by the designer. In various embodiments, values corresponding to term $T(T)=e^{\delta \cdot (T-T_0)}$ may be stored in the storage unit 202 and values corresponding to the term $$V(V_{dd}, V_{th}) = \frac{V_{dd}}{V_{dd0}} \cdot e^{\beta(V_{dd}-V_{dd0})} \cdot e^{\gamma \cdot (-|V_{th}|+|V_{th0}|)}$$

may be stored in the storage units 204 (or 252). Hence, a multiplier (208, 254) may be used to multiply the terms T(T) and V($V_{dd}$, $V_{th}$) to provide value of P.

Moreover, in one embodiment, dynamic calibration of an IC component may be performed in idle mode (e.g., where there is no dynamic power consumption). In such situation, the temperature increase (over a controlled ambient temperature) in each portion (e.g., blocks) of the IC component may be dependant upon the leakage power. The thermal sensors 108 that may be placed in the blocks can report the stable temperature (e.g., after a relatively long period of time). With the temperature map, a tool (such as a computing device that is external to the IC component) may derive the power map that is causing the scenario, e.g., via reverse-engineering. The leakage values may then be computed based on the static temperatures of the portions (since other constants may be known, such as supply voltage, threshold voltage, and ambient temperature), Once the power map is computed it may be stored in the reference leakage storage 206. In an embodiment, a special dedicated microcode may be used to communicate between the IC component being calibrated and test equipment (e.g., to report the temperature readings and to perform the base leakage update).

Figure 5:
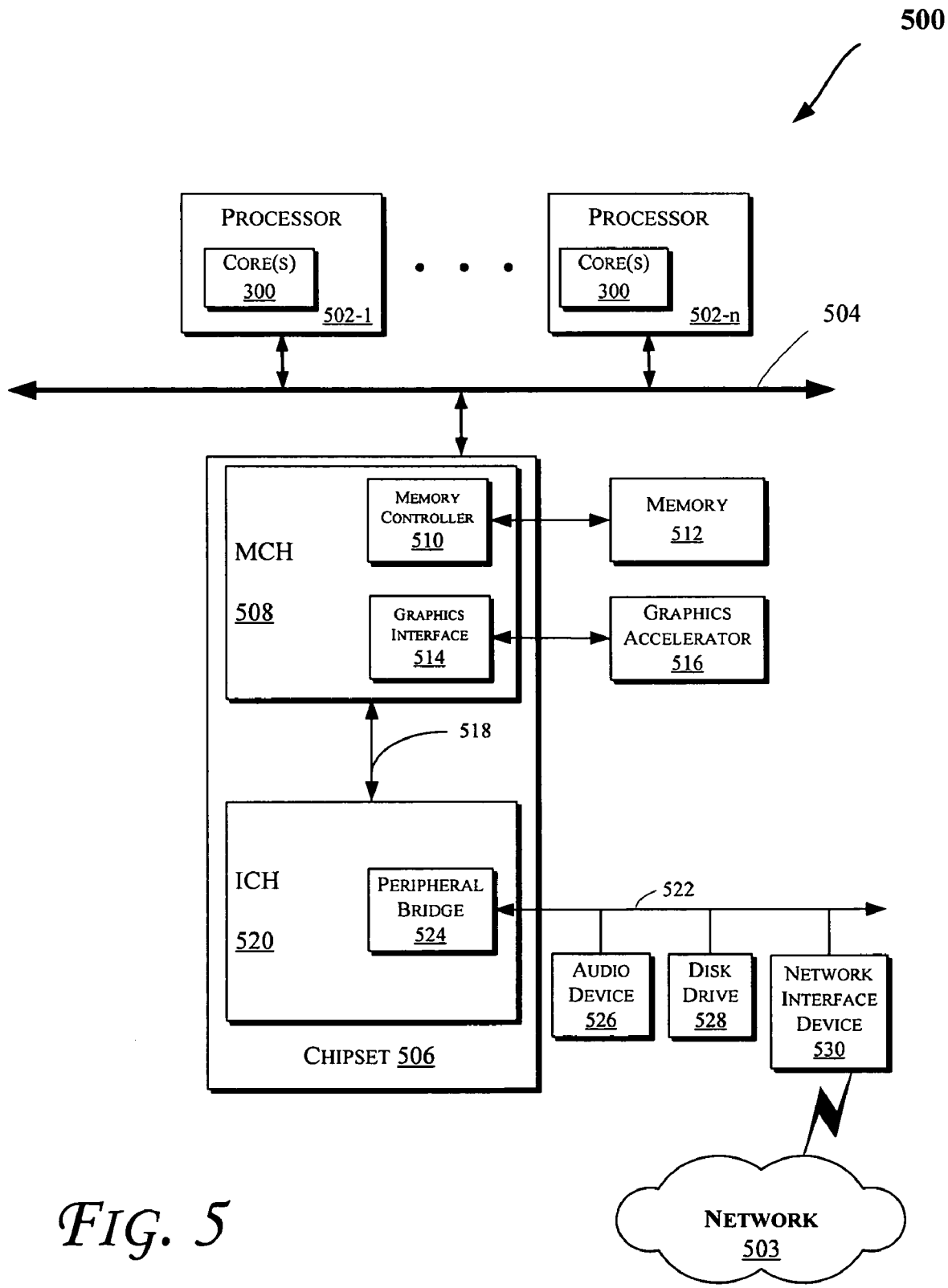

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may be any type of a processor such as a general purpose processor, a network processor (that processes data communicated over a computer network 503), or other types of a processor (including a reduced instruction set computer (RISC) processor or a complex instruction set computer (CISC)). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors. In an embodiment, one or more of the processors 502 may utilize the embodiments discussed with reference to FIGS. 1-4. For example, one or more of the processors 502 may include one or more processor cores (300). Also, the operations discussed with reference to FIGS. 1-4 may be performed by one or more components of the system 500.

A chipset 506 may also communicate with the interconnection network 504. The chipset 506 may include a memory control hub (MCH) 508. The MCH 508 may include a memory controller 510 that communicates with a memory 512. The memory 512 may store data and sequences of instructions that are executed by the CPU 502, or any other device included in the computing system 500. In one embodiment of the invention, the memory 512 may include one or more volatile storage (or memory) devices such as random access memory (RAM), dynamic RAM (DRAM), synchronous DRAM (SDRAM), static RAM (SRAM), or the like. Nonvolatile memory may also be utilized such as a hard disk. Additional devices may communicate via the interconnection network 504, such as multiple CPUs and/or multiple system memories.

The MCH 508 may also include a graphics interface 514 that communicates with a graphics accelerator 516. In one embodiment of the invention, the graphics interface 514 may communicate with the graphics accelerator 516 via an accelerated graphics port (AGP). In an embodiment of the invention, a display (such as a flat panel display) may communicate with the graphics interface 514 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display.

A hub interface 518 may allow the MCH 508 to communicate with an input/output control hub (ICH) 520. The ICH 520 may provide an interface to I/O devices that communicate with components of the computing system 500. The ICH 520 may communicate with a bus 522 through a peripheral bridge (or controller) 524, such as a peripheral component interconnect (PCI) bridge, a universal serial bus (USB) controller, or the like. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or the like.

The bus 522 may communicate with an audio device 526, one or more disk drive(s) 528, and a network interface device 530 (which communicates with the computer network 503). Other devices may be in communication with the bus 522. Also, various components (such as the network interface device 530) may be in communication with the MCH 508 in some embodiments of the invention. In addition, the processor 502 and the MCH 508 may be combined to form a single chip. Furthermore, the graphics accelerator 516 may be included within the MCH 508 in other embodiments of the invention.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media capable of storing electronic instructions and/or data.

Figure 6:
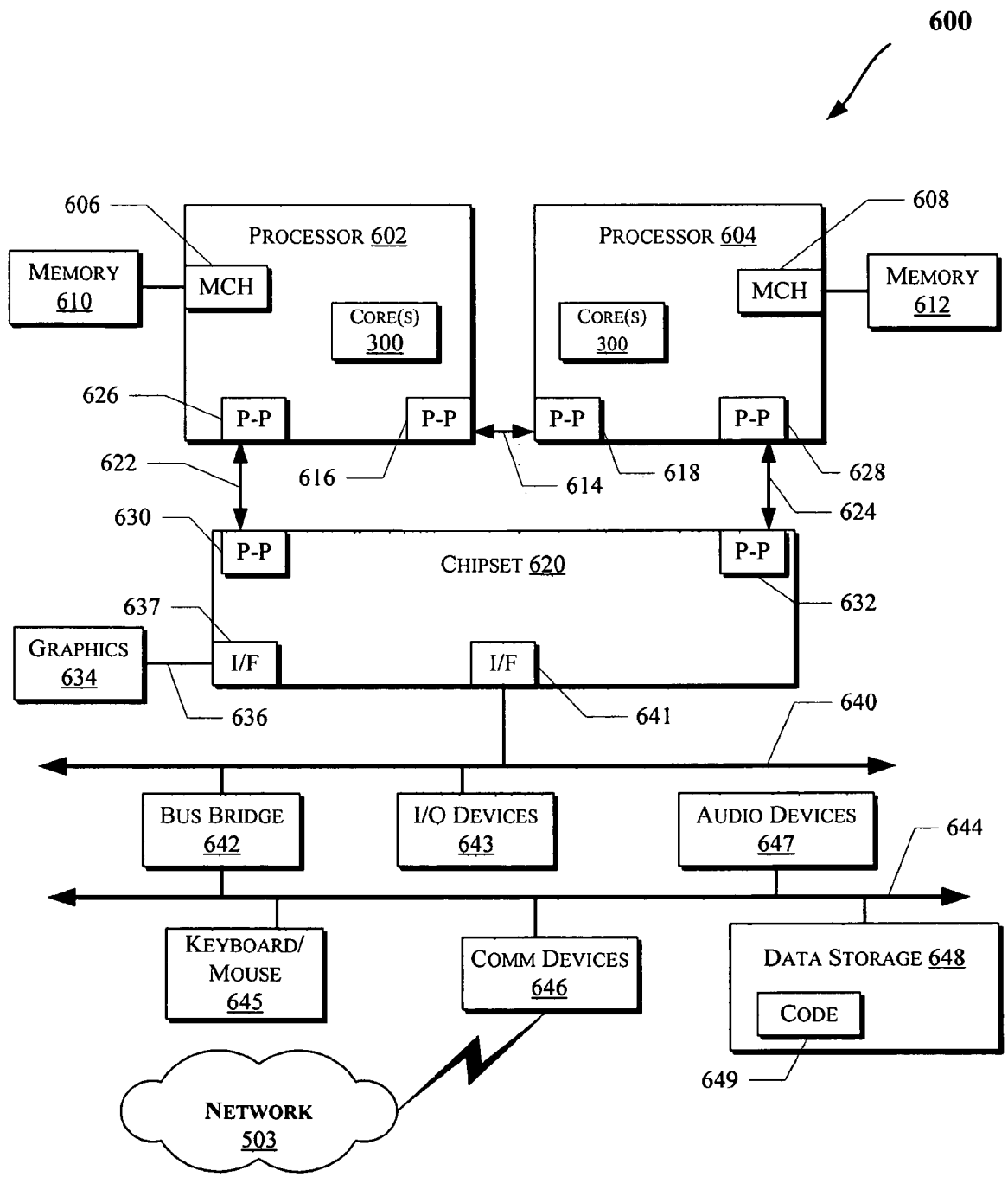

FIG. 6 illustrates a computing system 600 that is arranged in a point-to-point (PtP) configuration, according to an embodiment of the invention. In particular, FIG. 6 shows a system where processors, memory, and input/output devices are interconnected by a number of point-to-point interfaces. The operations discussed with reference to FIGS. 1-5 may be performed by one or more components of the system 600.

As illustrated in FIG. 6, the system 600 may include several processors, of which only two, processors 602 and 604 are shown for clarity. The processors 602 and 604 may each include a local memory controller hub (MCH) 606 and 608 to allow communication with memories 610 and 612. The memories 610 and/or 612 may store various data such as those discussed with reference to the memory 512.

The processors 602 and 604 may be any type of a processor such as those discussed with reference to the processors 502 of FIG. 5. The processors 602 and 604 may exchange data via a point-to-point (PtP) interface 614 using PtP interface circuits 616 and 618, respectively. The processors 602 and 604 may each exchange data with a chipset 620 via individual PtP interfaces 622 and 624 using point to point interface circuits 626, 628, 630, and 632. The chipset 620 may also exchange data with a high-performance graphics circuit 634 via a high-performance graphics interface 636, using a PtP interface circuit 637.

At least one embodiment of the invention may be provided within the processors 602 and 604. For example, one or more of the domains 102 discussed with reference to FIG. 1 and/or processor core(s) 300 may be located within the processors 602 and 604. Other embodiments of the invention, however, may exist in other circuits, logic units, or devices within the system 600 of FIG. 6. Furthermore, other embodiments of the invention may be distributed throughout several circuits, logic units, or devices illustrated in FIG. 6.

The chipset 620 may communicate with a bus 640 using a PtP interface circuit 641. The bus 640 may have one or more devices that communicate with it, such as a bus bridge 642 and I/O devices 643. Via a bus 644, the bus bridge 643 may be in communication with other devices such as a keyboard/mouse 645, communication devices 646 (such as modems, network interface devices, etc. that may be in communication with the computer network 503), audio I/O device, and/or a data storage device 648. The data storage device 648 may store code 649 that may be executed by the processors 602 and/or 604.

In various embodiments of the invention, the operations discussed herein, e.g., with reference to FIGS. 1-6, may be implemented by hardware (e.g., circuitry), software, firmware, microcode, or combinations thereof, which may be provided as a computer program product, e.g., including a machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-6. Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
a first logic circuitry to generate a first signal corresponding to one or more sensed temperature values; and
a second logic circuitry to generate a second signal corresponding to one or more voltage values;
a third logic circuitry to generate a third signal corresponding to a leakage power value based on the first signal and the second signal, wherein the one or more voltage values are to comprise a current value of a threshold voltage and a current value of a supply voltage; and
a fourth logic to generate a fourth signal corresponding to a base leakage power value, wherein the third logic generates the third signal based on the first signal, the second signal, and the fourth signal.

2. The apparatus of claim 1, further comprising a fifth logic to adjust power consumption of one or more components of a computing system based on the third signal.

3. The apparatus of claim 1, wherein the leakage power value corresponds to leakage power consumed by a device to which the sensed temperature values and the one or more voltage values correspond.

4. The apparatus of claim 1, further comprising a storage unit to store a plurality of temperature values, wherein the first logic generates the first signal based on one of the plurality of stored temperature values.

5. The apparatus of claim 1, further comprising a storage unit to store a plurality of voltage values, wherein the second logic generates the second signal based on one of the plurality of stored voltage values.

6. The apparatus of claim 1, further comprising a storage unit to store a plurality of leakage power values, wherein the plurality of leakage power values are indexed by the temperature and the voltage.

7. The apparatus of claim 1, further comprising one or more temperature sensors to sense the temperature values.

8. The apparatus of claim 1, wherein the third logic comprises a multiplier to multiply the first and second signals to provide the third signal.

9. The apparatus of claim 1, further comprising one or more processor cores, wherein at least one of the one or more processor cores comprises one or more of the first logic, the second logic, or the third logic.

10. The apparatus of claim 1, further comprising one or more processor cores, wherein at least one of the one or more processor cores, the first logic, the second logic, and the third logic are on a same die.

11. A method comprising:
    determining a temperature scaling value corresponding to one or more temperature values sensed from a device;
    determining a voltage scaling value based on one or more voltage values corresponding to the device; and
    scaling a reference leakage power value of the device based on a base leakage power value, the temperature scaling value and the voltage scaling value to generate a signal corresponding to a leakage power of the device, wherein the one or more voltage values are to comprise a current value of a threshold voltage and a current value of a supply voltage.

12. The method of claim 11, wherein the sensing and scaling are performed during run-time of the device.

13. The method of claim 11, wherein determining the temperature scaling value comprises accessing a storage unit.

14. The method of claim 11, wherein determining the voltage scaling value comprises accessing a storage unit.

15. The method of claim 11, wherein scaling the reference leakage power value comprises multiplying the reference leakage power value by the temperature and voltage scaling values.

16. The method of claim 11, further comprising determining the reference leakage power value during test or design of the device.

17. A computing system comprising:
    a memory to store a plurality of bits representing a plurality of scaling factors;
    a first logic having one or more components to perform one or more computing operations; and
    a second logic to scale a base leakage power value corresponding to at least one of the one or more components based, at least in part, on sensed temperature variations and one or more of the plurality of stored scaling factors, wherein at least one of the plurality of stored scaling factors corresponds to a current value of a threshold voltage and a current value of a supply voltage,
    wherein the second logic is to comprise a multiplier to multiply a first signal corresponding to a temperature scaling value, a second signal corresponding to a voltage scaling value, and a third signal corresponding to the base leakage power value.

18. The computing system of claim 17, further comprising a third logic to adjust power consumption of at least one of the one or more components based on the scaled leakage power value.

19. The computing system of claim 17, wherein at least one of the plurality of stored scaling factors corresponds to a voltage scaling value.

20. The computing system of claim 19, wherein the voltage scaling value corresponds to one or more voltage values.

21. The computing system of claim 20, wherein the one or more voltage values comprise the current value of a threshold voltage and the current value of a supply voltage.

22. The computing system of claim 17, wherein the plurality of the stored scaling factors comprises a plurality of temperature scaling values and a plurality of voltage scaling values.

23. The computing system of claim 17, wherein the memory comprises a read-only memory.

24. The computing system of claim 17, further comprising one or more processor cores, wherein at least one of the one or more processor cores comprises one or more of the first logic, the second logic, or the memory.

25. The computing system of claim 17, further comprising one or more processor cores, wherein at least one of the one or more processor cores, the first logic, the second logic, and the memory are on a same die.

26. The computing system of claim 17, wherein the one or more computing operations comprise one or more of data processing, data storage, and data communication.

27. The computing system of claim 17, further comprising an audio device.

28. The computing system of claim 17, further comprising one or more sensors to sense the temperature variations.

* * * * *